US006933663B2

United States Patent
Takeuchi et al.

(10) Patent No.: US 6,933,663 B2
(45) Date of Patent: Aug. 23, 2005

(54) CELL DRIVING TYPE ACTUATOR AND METHOD FOR MANUFACTURING THE SAME

(75) Inventors: Yukihisa Takeuchi, Nishikamo-Gun (JP); Hiroyuki Tsuji, Nagoya (JP); Kazumasa Kitamura, Itinomiya (JP); Nobuo Takahashi, Owariasahi (JP)

(73) Assignee: NGK Insulators, Ltd., Nagoya (JP)

( * ) Notice: Subject to any disclaimer, the term of this patent is extended or adjusted under 35 U.S.C. 154(b) by 26 days.

(21) Appl. No.: 10/117,353

(22) Filed: Apr. 5, 2002

(65) Prior Publication Data

US 2003/0020370 A1 Jan. 30, 2003

Related U.S. Application Data

(63) Continuation-in-part of application No. 09/888,048, filed on Jun. 22, 2001, now abandoned.

(30) Foreign Application Priority Data

Apr. 6, 2001 (JP) ........................................ 2001-108986
Jun. 22, 2001 (JP) ........................................ 2001-189718

(51) Int. Cl.$^7$ .............................................. H01L 41/08
(52) U.S. Cl. ..................................... 310/367; 310/328
(58) Field of Search ........................... 310/323.02, 328, 310/358, 359, 367

(56) References Cited

U.S. PATENT DOCUMENTS

| 5,471,231 | A | * | 11/1995 | Hiraishi et al. | ............... 347/68 |
| 6,106,106 | A | * | 8/2000 | Nakazawa et al. | ............ 347/68 |
| 6,206,496 | B1 | * | 3/2001 | Ushioda | ..................... 347/10 |
| 6,223,405 | B1 | * | 5/2001 | Oikawa et al. | |
| 6,361,151 | B1 | * | 3/2002 | Shigemura | ................... 347/68 |

FOREIGN PATENT DOCUMENTS

| JP | 07-081055 | 3/1995 |
| JP | 07-329290 A1 | 12/1995 |

* cited by examiner

Primary Examiner—Mark Budd
(74) Attorney, Agent, or Firm—Burr & Brown

(57) ABSTRACT

A piezoelectric/electrostrictive actuator includes a plurality of piezoelectric/electrostrictive elements arranged in comb teeth-like alignment on a base plate. The actuator is driven by means of dislocation of the piezoelectric/electrostrictive elements. The cell driving type actuator is characterized in that each of the cells is formed independently from adjacent cells by positioning cover plates between two adjacent piezoelectric/electrostrictive elements. Thus, there is provided a piezoelectric/electrostrictive actuator wherein a heating process at a high temperature can be applied and mass production at low cost is possible. The actuator includes cells with slit portions having a width of 60 $\mu$m or less and a high aspect ratio and can be activated with high electric field strength, and great displacement can be obtained with small electric field strength.

12 Claims, 13 Drawing Sheets

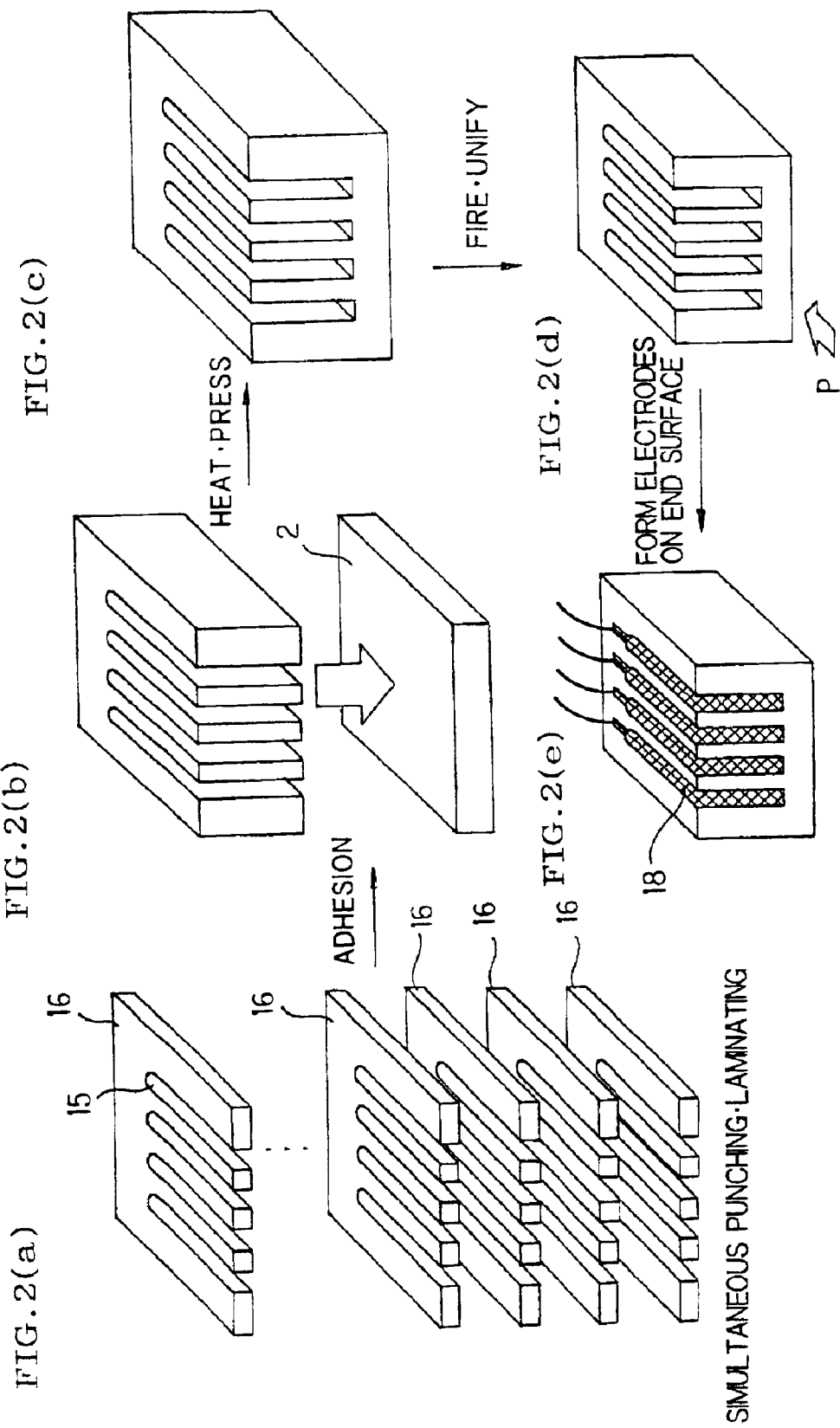

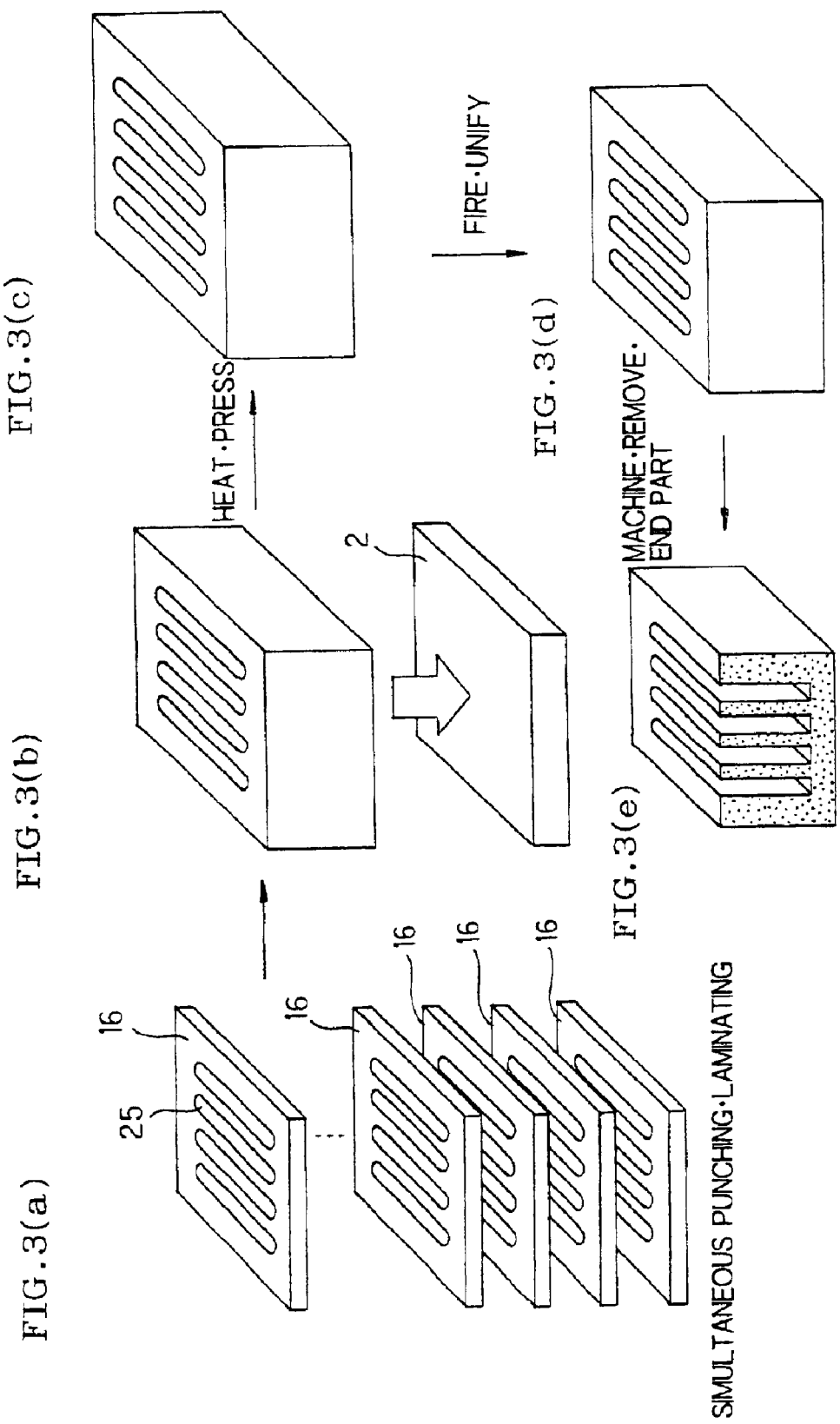

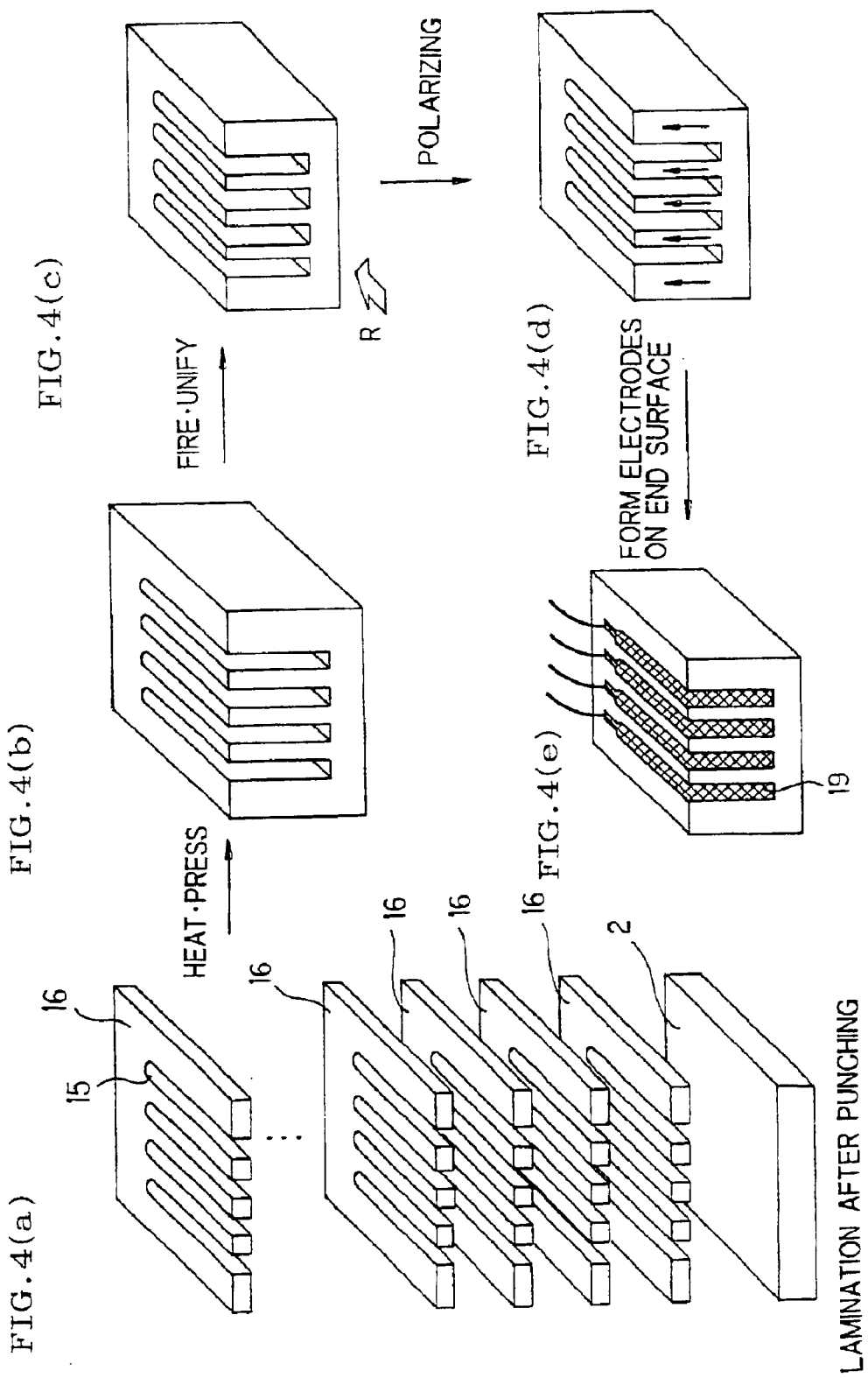

COMB TOOTH | SLIT

FIG. 8(a)
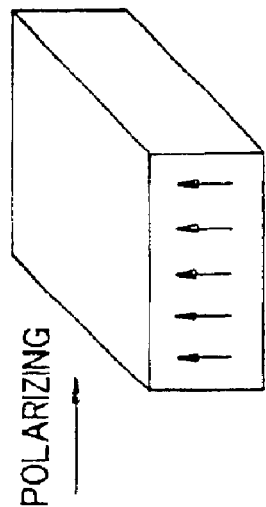
FIG. 8(b)
FIRE →
FIG. 8(c)
POLARIZING →
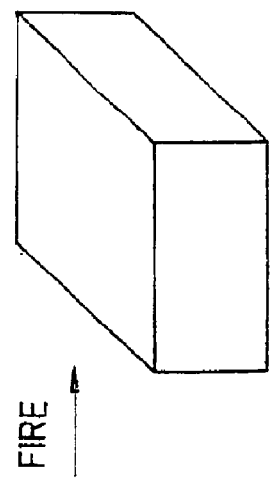
DICING STEP ↓
FIG. 8(d)
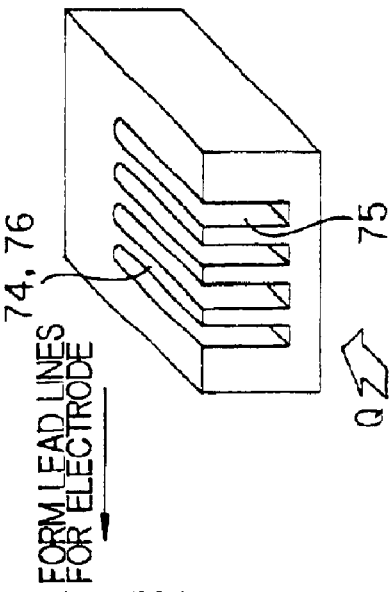
FORM LEAD LINES FOR ELECTRODE ↓
FIG. 8(e)
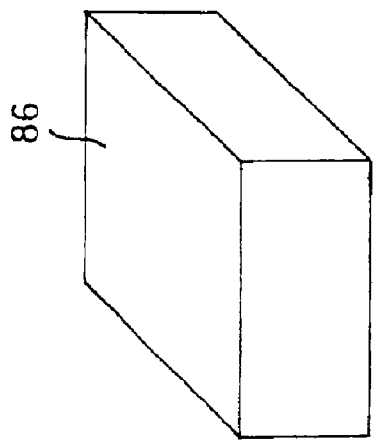

CELL DRIVING TYPE ACTUATOR AND METHOD FOR MANUFACTURING THE SAME

CROSS-REFERENCE OF RELATED APPLICATION

This application is a Continuation-in-Part of U.S. patent application Ser. No. 09/888,048, filed on Jun. 22, 2001, now abandoned.

BACKGROUND AND TECHNICAL FIELD OF THE INVENTION

The present invention relates to a cell driving type piezoelectric/electrostrictive actuator. More particularly, it relates to a cell driving type actuator having cells each being formed independently by two piezoelectric/electrostrictive elements, wherein the piezoelectric/electrostrictive elements forming the cells are displaced preferably by a driving electric field applied in the same direction as the polarization field of the piezoelectric elements or in the direction perpendicular to cell wall surfaces of the electrostrictive elements.

There is known, as a conventional piezoelectric actuator, for instance, a piezoelectric actuator being driven in the shear mode and being used in an ink jet head. With reference to FIG. 7, a piezoelectric actuator 71 includes a plurality of piezoelectric elements having driving parts 74 which include comb teeth 76 on a base plate 72. Slits 75 exists between the comb teeth 76 and are closed by a cover plate 77 so as to form cells 73 in a generally rectangular parallelepiped form. An ink head 70 where the cell 73 is used as an ink chamber is constituted by closing the respective openings at the front end of comb teeth in the piezoelectric actuator 71 with a nozzle plate 9 having nozzles 8. The comb teeth 76 are deformed so as to change the volume of the cell 73 by applying a driving electric field in the direction perpendicular to the direction of the polarization field in comb teeth 76 used in driving parts 74, which are made of a piezoelectric material. Accordingly, the ink filled into the cell 73 can be ejected.

The above-discussed driving method is the shear mode method in which the driving electric field is applied in the direction perpendicular to the polarization field of the piezoelectric elements to displace the piezoelectric elements.

Such a piezoelectric actuator 71 has been constructed by the procedure shown in FIG. 8(a)–FIG. 8(e). First, a piezoelectric material 86 is provided as in FIG. 8(a), and fired as shown in FIG. 8(b). Subsequently, the polarizing treatment is carried out as shown in FIG. 8(c). In FIG. 8(d), the process of forming fine slits is carried out by using a dicing saw or the like, and the driving parts 74, which cause the dislocation due to the application of the driving electric field, are formed like teeth of a comb in alignment by interposing a plurality of slits 75 to be a space for storing the ink therein. Electrodes 88 are formed on the walls of the slits 75 as shown in FIG. 8(e). Thereafter, as shown in FIG. 7, the cells 73 to be filled with an ink are formed by applying the cover plate 77 formed by a glass plate or the like thereto, and by closing the front ends of the comb teeth 76 with a nozzle plate 9 having nozzles 8.

Such a manufacturing method has, however, the following problems due to the machining of hard piezoelectric materials.

The first problem is that it is time-consuming to machine the slits constituting the cells, so that the method is unsuitable for mass production.

The second problem is that since the resultant slits are polluted with either free abrasive grains used for machining or a liquid used for machining, a satisfactory cleaning is required after the machining process. The cleaning step is a complex process and the mechanical strength is reduced after the slits are formed. Moreover, it requires inevitably a drying process. Additionally, the cost increases since facilities and the management for cleaning water and exhaust water are required.

The third problem is that it is difficult to form cells having a high aspect ratio of, for example, more than 10 because the slits constituting the cells to be filled with an ink can not be machined with a width of approximately 60 μm or less due to the restriction derived from the thickness of the dicing blade used for the machining, and regarding the thickness of a comb tooth, i.e., a driving part, a limited value is automatically determined with respect to the depth since the grinding strength is required for the dicing blade. As a result, it is difficult to form actuator having a high density or having a high strength and a high power.

Incidentally, the aspect ratio is generally defined by the ratio of the diameter and the axial length in the case of a cylindrical aperture, whereas, in the case of non-cylindrical aperture, for instance, the slit 75 providing a cell made by closing it in subsequent processing, as shown in FIG. 8(d), the aspect ratio is defined by the ratio of the minimum spacing between two facing comb teeth 76, i.e., the width of the slit 75, and the depth of the slit 75. A cell of a high aspect ratio means a cell having a slit whose depth is relatively large in comparison with the width.

The fourth problem is that the process of bonding parts is always required in the subsequent processing when cells having a complex form are produced because only straight and flat slits can be formed due to the machining with a dicing blade. Moreover, the deformation due to the piezoelectric stress extends up to the bounded end of the nozzle plate during operation as a consequence of the straight line machining, and thus it is liable to result in the reduction in the durability of the bonding face.

The fifth problem is that the characteristics of the cells are liable to be deteriorated because side faces of comb-like driving parts 74 are apt to become uneven since the slits are formed by the grinding process after firing. FIG. 9(a) and FIG. 9(b) are drawings illustrating this effect. FIG. 9(a) is a side view of the end face viewed from Q in FIG. 8(d), and FIG. 9(b) shows an enlarged section of the part N in FIG. 9(a). In the grinding process with the dicing saw, micro cracks and transgranular fractures are often present in the side faces of comb-like driving parts 74 (comb teeth 76) due to the machining. As a result, it sometimes happens that the intrinsic performance of the material is not attained or that the device itself breaks due to the propagation of micro cracks when the cells are driven.

Moreover, in the conventional piezoelectric actuator 71, there are several problems attributed to the operation in the shear mode.

The sixth problem subsequent to the fifth problem is that, after firing and carrying out the polarization treatment, the manufacturing process including heating at a temperature higher than the Curie temperature cannot be carried out because the polarization in the piezoelectric material melts away. Therefore, in the case of fixing or wiring the actuator to, e.g., a circuit board, neither soldering by a reflow soldering method or the like nor bonding while heating can be carried out, otherwise, such a process suffers a thermal restriction, and thus throughput is reduced, thereby increasing the cost of manufacturing. Moreover, a machining process inducing heat, such as laser processing or the like, also provides such a restriction.

In addition, as the seventh problem, it can be pointed out that the actuator cannot be driven with a high field strength which provides a change in the state of polarization since the driving electric field is applied in the direction perpendicular to that of the polarization field. The high driving field strength gradually changes the state of polarization during the period of operation, hence reducing the magnitude of the strain. As a result, the basic performance of the actuator is reduced.

Moreover, in the conventional piezoelectric actuator 71, there is a problem due to the structure in which the base plate, driving parts, and the cover plate are integrated in one body, inclusive of the problems resulting from the aforementioned method for machining and the problem inherent in the shear-mode operation.

The eighth problem is that it is impossible to make adjacent cells behave in the same way. FIG. 15 shows sectional views of an embodiment of piezoelectric actuator 71 in deactivated and activated states. In the case that the driving electric field is in OFF state, the driving parts 74, i.e., the piezoelectric elements are not deformed, whereas in the case that the driving electric field is ON state to the specified driving parts, the driving parts 74 are deformed. As obvious from FIG. 15, an increase in the volume of a cell results in a decrease in the volume of its adjacent cell since the driving part 74 acts as a driving component for the two cells 73. When, for instance, the piezoelectric actuator 71 is used as the ink jet head 70 as shown in FIG. 7, the ink cannot be ejected simultaneously from adjacent cells. Therefore, at least two driving operations are needed in order to spray ink particles to an article to be sprayed. This is not preferable from the viewpoint of the improvement in the ink discharging rate.

SUMMARY OF THE INVENTION

The present invention has been completed in view of the aforementioned problems and aims to provide a piezoelectric/electrostrictive actuator to which a high-temperature heating process can be applied, which ensures mass production at a low cost. The piezoelectric/electrostrictive actuator can be driven with a high-strength electric field, which has cells not limited to ones each having sectional shape formed by straight lines, i.e., cells including a comb-like piezoelectric/electrostrictive element having the width varied from a recess to the front end of the comb tooth, cells with cell width of 60 $\mu$m or less, and cells having a high aspect ratio, thereby enabling great displacement to be realized with a weak electric field, and also to provide a method for manufacturing the same.

That is, as a result of making numerous investigations regarding piezoelectric/electrostrictive actuators and methods for manufacturing the same, it was found that the afore-mentioned problems can be solved by the cell driving type actuator and by the method for manufacturing it as shown below.

According to the present invention, there is provided a cell driving type actuator comprising a plurality of piezoelectric/electrostrictive elements arranged in alignment like the teeth of a comb on a base plate. The actuator is a piezoelectric/electrostrictive actuator driven by means of dislocation of the piezoelectric/electrostrictive elements, characterized in that each of the cells is formed independently from adjacent cells by closing respective planes being positioned between two adjacent piezoelectric/electrostrictive elements and facing the base plate with respective cover plates. In the present invention, in the case of an actuator using the piezoelectric elements among said piezoelectric/electrostrictive elements, it is preferable that the polarization field and the driving electric field of said piezoelectric elements are aligned in the same direction. In addition, it is preferable that the actuator is a piezoelectric/electrostrictive actuator driven by applying a voltage on an electrode film formed on both surfaces of each of adjacent piezoelectric/electrostrictive elements forming said cells and that the dislocation of the piezoelectric/electrostrictive elements is expansion or shrinkage in a vertical direction.

In a cell driving type actuator of the present invention, crystal grains on a surface of the piezoelectric/electrostrictive elements forming said cell are preferably under such a condition that crystal grains having a transgranular fracture is 1% or less. It is preferable that the degree of profile for the surface of said cells is approximately 8 $\mu$m or less. It is preferable that the ratio of the minimum spacing between the adjacent piezoelectric/electrostrictive elements forming said cell to the minimum spacing between said base plate and said cover plate is approximately 1:2 to 1:40. Further, it is preferable that the ratio of the spacing between each of said cells and the adjacent cells to the minimum spacing between said base plate and said cover plate is approximately 1:2 to 1:40. It is preferable that the minimum spacing between the adjacent piezoelectric/electrostrictive elements forming said cells is approximately 60 $\mu$m or less and that the spacing between each of said cells and the adjacent cells is approximately 50 $\mu$m or less.

In a cell driving type actuator of the present invention, it is preferable that the surface roughness Rt of the walls of the piezoelectric/electrostrictive elements is approximately 10 $\mu$m or less, said elements facing one another and forming said cell. The width of the comb-like piezoelectric/electrostrictive elements preferably varies from a recess to the front end of the comb tooth. It is also preferable that the spacing between the adjacent piezoelectric/electrostrictive elements forming said cell, or the spacing between said cell and the adjacent cell has at least two different values.

According to the present invention, there is further provided, among aforementioned cell driving type actuators, a liquid discharging device wherein piezoelectric elements is utilized, each cell is utilized as a liquid pressurizing chamber, and the piezoelectric elements are displaced by applying a driving electric field thereto in the same direction as the polarization field of the piezoelectric elements so that the piezoelectric elements expand or shrink in a vertical direction, thus deforming said liquid pressurizing chamber, thereby enabling a liquid filled into said liquid pressurizing chamber to be discharged in the direction of the front end of the comb teeth.

According to the present invention, the two methods for manufacturing the cell driving type actuator are further provided as shown below.

The first manufacturing method is a method for manufacturing, by utilizing a punch and a die, a cell driving type actuator wherein a plurality of piezoelectric/electrostrictive elements are arranged in alignment like the teeth of a comb on a base plate; each cell being formed by closing two adjacent piezoelectric/electrostrictive elements disposed on the base plate with a cover plate positioned at a plane facing the base plate in such a manner that said cell is formed independently from adjacent cells, characterized in that said method comprises the steps of: preparing a plurality of green sheets made of piezoelectric/ electrostrictive material, machining slit apertures in all of said green sheets with said punch, and laminating all the green sheets after positioning them, thus forming comb-like piezoelectric/electrostrictive elements.

The second manufacturing method is a method for manufacturing, by utilizing a punch and a die, a cell driving type actuator wherein a plurality of piezoelectric/ electrostrictive elements are arranged in alignment like the teeth of a comb on a base plate; each cell being formed by closing two adjacent piezoelectric/electrostrictive elements disposed on the base plate with a cover plate positioned at a plane facing the base plate in such a manner that said cell is formed independently from adjacent cells, characterized in that said method comprises: a step of preparing a plurality of green sheets made of piezoelectric/electrostrictive material, a first step of machining first slit apertures in a first green sheet with the punch, a second step of moving the first green sheet upwards into tight contact with a stripper in the state of not withdrawing the punch from the first slit apertures, a third step of moving the punch upwards in such a way that the front end of the punch is withdrawn slightly from the lowest part of the first green sheet which was moved upwards, a fourth step of machining second slit apertures in a second green sheet with the punch, a fifth step of moving the second green sheet upwards, together with the first green sheet in the state of not withdrawing the punch from the second slit apertures, and a sixth step of moving the punch upwards in such a way that the front end of the punch is withdrawn slightly from the lowest part of the second green sheet which was moved upwards, and thereafter, laminating a plurality of green sheets by repeating the fourth to sixth steps so as to form a comb-like piezoelectric/ electrostrictive elements.

BRIEF DESCRIPTION OF THE DRAWINGS

FIGS. 2(a)–2(e) are schematic drawings for explaining an embodiment of a method for manufacturing a cell driving type actuator according to the invention.

FIGS. 3(a)–3(e) are schematic drawings for explaining another embodiment of a method for manufacturing another cell driving type actuator according to the invention.

FIGS. 4(a)–4(e) are schematic drawings for explaining another embodiment of a method for manufacturing another cell driving type actuator according to the invention.

FIG. 5(a) is a side view from the position P in FIG. 2(d), and FIG. 5(b) is an enlarged schematic sectional view of part M in FIG. 5(a).

FIG. 6(a) shows a step of preparing the first sheet by mounting the initial green sheet onto a die; FIG. 6(b) shows a step of punching the initial green sheet; FIG. 6(c) shows a second step of preparing the second sheet by mounting the second green sheet; FIG. 6(d) shows a step of punching the second green sheet; and FIG. 6(e) is a drawing showing a step of completing punching, where the laminated green sheets are removed with a stripper after the completion of punching and laminating all the sheets.

FIGS. 8(a)–8(e) are schematic drawings showing steps of an embodiment of a method for manufacturing a conventional piezoelectric/electrostrictive actuator.

FIG. 9(a) is a side view from position Q in FIG. 8(d), and FIG. 9(b) is an enlarged schematic sectional view of part N in FIG. 9(a).

FIG. 13(a) is a sectional view showing an embodiment in the case that the slit width is kept at a fixed value, whereas FIG. 13(b) is a sectional view showing an embodiment in the case that the slit width varies.

DETAILED DESCRIPTION OF THE INVENTION

The cell driving type actuator and the method for manufacturing the actuator of the present invention will be concretely explained. However, the present invention is not restricted to such an explanation, and rather various revisions, modifications and/or corrections are possible on the basis of the knowledge of a person of ordinary skill, without departing from the spirit and the scope of the present invention.

Incidentally, a cell driving type actuator of the present invention is a piezoelectric/electrostrictive actuator where each of cells formed by closing respective planes being positioned between two adjacent piezoelectric/ electrostrictive elements and facing the base plate with respective cover plates is formed independently from adjacent cells and the cells can be driven independently, and an actuator utilizing a strain induced by an electric field. A cell driving type actuator of the present invention is not limited to a piezoelectric actuator or an electrostrictive actuator of a narrow sense, utilizing a piezoelectric effect generating a quantity of strain almost proportional to the applied electric field or an electrostrictive effect generating a quantity of strain almost proportional to a square of the applied electric field and includes an actuator utilizing a phenomenon such as polarization reverse shown in overall ferroelectric materials, antiferroelectric phase—ferro-electric phase transition shown in antiferroelectric materials, or the like. Therefore, whether a polarization treatment is carried out or not is determined suitably on the basis of properties of the material to be used for piezoelectric/electrostrictive elements constituting a piezoelectric/electrostrictive actuator of the present invention. For example, it should be understood in the present specification that the driving parts of the actuator are constituted by piezoelectric elements as a premise, on an occasion that a polarization field is applied.

Additionally, in the present specification, the expression to drive an actuator means to drive at least one cell, and to drive a cell means to form a pressurized or a depressurized state in the cell by changing the volume of the cell with deforming the driving parts constituting the cell under application of a driving electric field.

Figure 1:
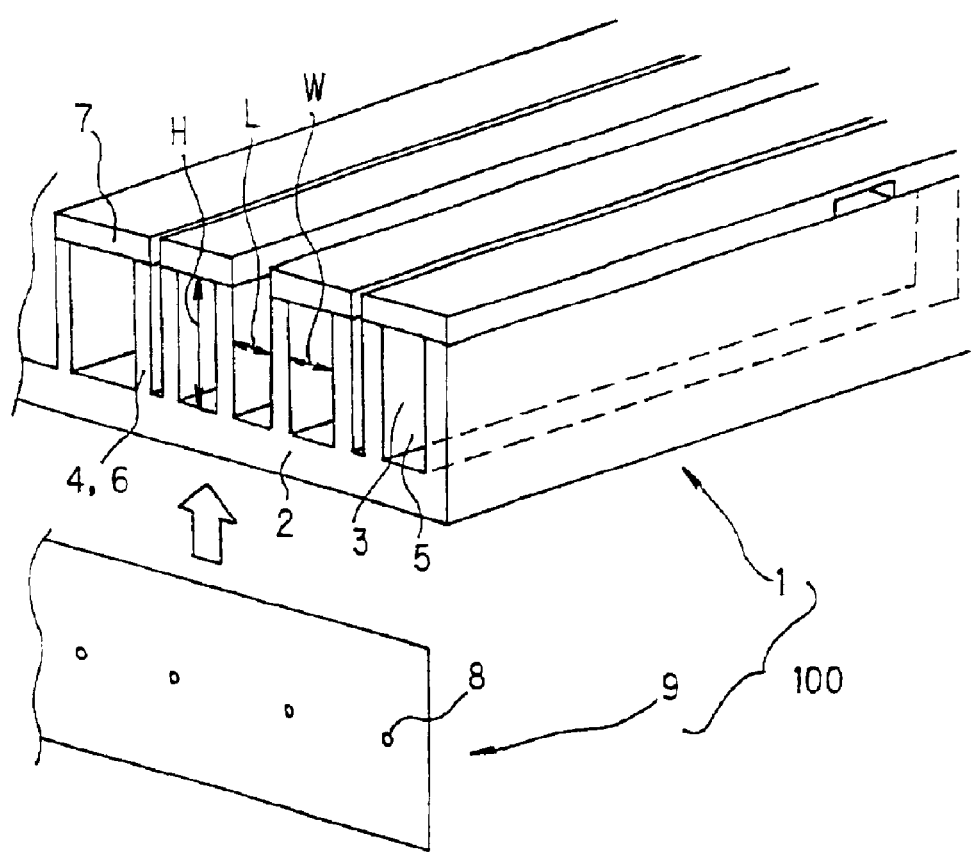
FIG. 1 is a perspective view of an embodiment of a cell driving type actuator according to the invention.

Description is hereinbelow given with referring to the drawings. FIG. 1 is a perspective view showing an embodiment of a cell driving type actuator according to the invention. In a cell driving type actuator 1, a plurality of piezoelectric/electrostrictive elements, which are regarded as comb teeth 6 or driving parts 4, are formed like teeth of a comb on a base plate 2, and approximately rectangle-shaped cells 3 are formed by closing the slits 5 between two adjacent comb teeth 6 with cover plates 7. Incidentally, in the following drawings, it should be understood that the following reference numerals have the following meanings, respectively.

That is, 1 denotes a cell driving type actuator; 2, 72 and 162 denote base plates; 3, 73 and 113 denote cells; 4, 74, 114, 134 and 164 denote driving parts; 5, 75 and 125 denote slits; 6, 76 and 126 denote comb teeth; 7 and 77 denote cover plates; 8 denotes a nozzle; 9 denotes a nozzle plate; 10 denotes a punch; 11 denotes a stripper; 12 denotes a die; 15 and 25 denote slit apertures; 16 and 16a–16c denote green sheets; 17 denote a separation tools; 18, 19 and 88 denote electrodes; 70 denotes an ink jet head; 71 denotes a piezoelectric actuator; 86 denotes a piezoelectric material; 100 denotes a liquid discharging device; 130 denotes a product to be transported; 160 denotes a micro-mirror device; and 161 denotes a micro-mirror.

For instance, in FIG. 1, a liquid discharging device 100 having driving parts 4 constituted by piezoelectric elements can be constituted by closing openings at the front end of the comb teeth of the cell driving type actuator with a nozzle plate 9 having nozzles 8, wherein the cells 3 are used as liquid pressurizing chambers, and thereby the liquid in the cells 3 is ejected by changing the volume of the cells 3 by applying driving electric field to the comb teeth 6, i.e., the driving parts 4 made of piezoelectric/electrostrictive material, in the same direction as the polarization field so that the comb teeth 6 expand or shrink in a vertical direction. The liquid discharging device 100 can be applied, for instance, in the head of an ink jet printer, or in manufacturing DNA chips necessary for mixing liquids in a trace amount and for giving rise to a reaction therein, as well as for analyzing gene structure in the field of biotechnology; or in a micro droplet discharging apparatus which is used in coating processes in semiconductor device production.

Figure 15:
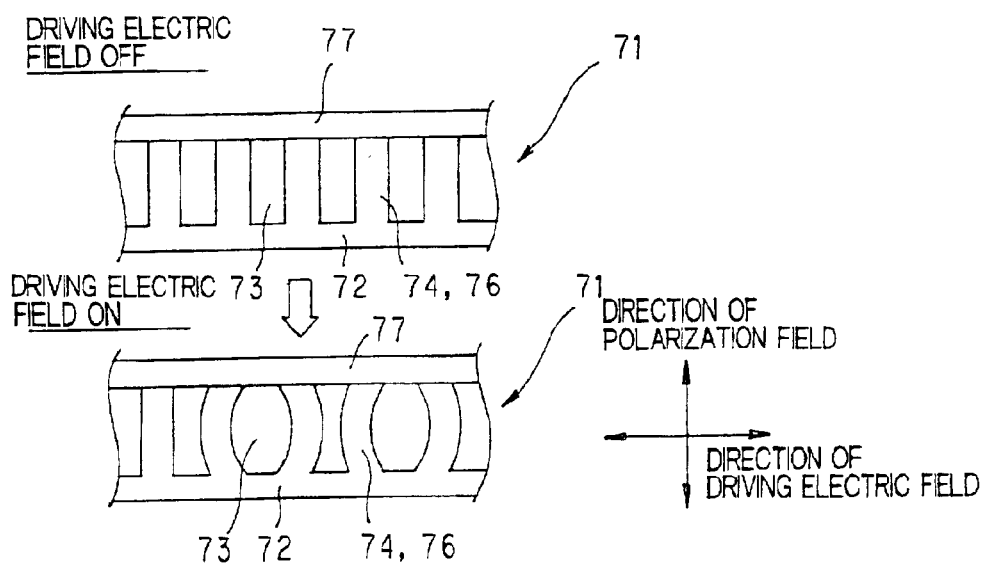
FIG. 15 is sectional views showing the deactivated and activated states of the conventional cell driving type actuator.

The cell driving type actuator 1 of the present invention is characterized in that the cells 3 formed by closing the surface facing the base plate 2 between two adjacent comb teeth 6 by the cover plates 7 are constituted independently from adjacent cells 3 unlike the conventional piezoelectric/electrostrictive actuator, in which the base plate, comb teeth and cover plate are unified in one body so as to form a plurality of cells by a common cover plate, or in which one tooth, i.e., a driving part is served, as a driving member for the two cells. In addition, the present cell driving type actuator 1 has a characteristic point in that the polarization field of the piezoelectric elements constituting the driving part 4 is aligned in the same direction as the driving electric part 4, on an occasion that piezoelectric elements are utilized. Furthermore, it has a characteristic point that an electrode film is formed on both side faces of each of the comb teeth 6 forming the cells 3 so that the comb teeth 6 expand and shrink in a vertical direction by applying a voltage to the film, unlike the conventional piezoelectric actuator 71 shown in FIG. 15, which generates pressure by a bend of the comb teeth 76 constituting the cells 73.

Each of cells 3 has a structure in which it is closed by a separate cover plate 7 and formed to be independent from adjacent cells 3, thereby enabling each cell 3 to be driven completely independently of the other cells 3. Moreover, it is possible to operate the adjacent cells 3 in the same manner.

Figure 14:
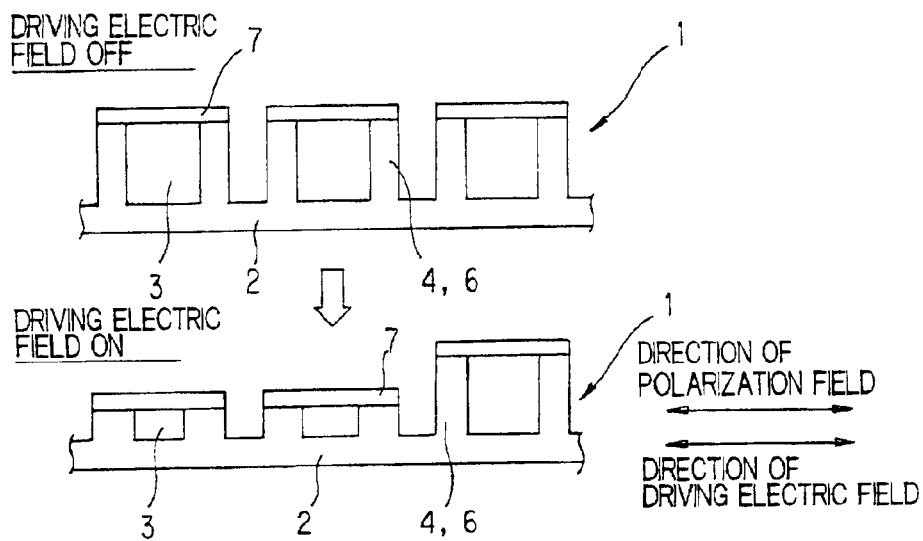
FIG. 14 is sectional views showing the deactivated and activated states of the cell driving type actuator according to the invention.

FIG. 14 shows sectional views showing examples in deactivated and activated states of the cell driving type actuator 1 of the present invention. When a driving electric field is in OFF state, driving parts 4, i.e., piezoelectric/electrostrictive elements do not deform, whereas, when the driving electric field is in ON state to a specified driving part 4, the driving part 4 deforms. In this case, each of the cells 3 is constructed by two driving parts 4 arranged on the base plate 2 and by the cover plate 7, which closes only a plane facing the base plate 2 between the two driving parts 4. Accordingly, the activation of the cell 3 and the activation of the adjacent cells 3 can be carried out independently of each other, without any restriction in the amount of displacement, and it is therefore possible to give rise to the same action for the two adjacent cells 3, as shown in FIG. 14. Accordingly, a less field strength is required to obtain the same magnitude of displacement, compared with the conventional actuator.

On an occasion that the cell driving type actuator 1 is used, for instance, as the aforementioned liquid discharging device 100, a liquid can be discharged simultaneously from the adjacent cells 3, hence the frequency of activating cells 3 is reduced compared with the conventional cells, thus succeeding in increasing the rate of liquid discharge. More concretely, the cost of production can be greatly reduced compared with the conventional actuator, if the liquid-discharging device 100 is used for the production of DNA chips.

Moreover, since the polarization field of the piezoelectric elements comprising the driving parts 4 is aligned in the same direction as the driving electric field in the case that piezoelectric elements are utilized, it is unnecessary to produce temporary or dummy electrodes for polarization and to apply the electric field thereto in the manufacturing process, thereby enhancing of the throughput can be intended. In addition, it is possible to employ a manufacturing process including heating at a temperature higher than the Curie temperature, irrespective of the presence of the polarization treatment. As a result, it is possible to fix and bond even the piezoelectric actuator to, e.g., a circuit board with reflow-soldering or thermosetting adhesion, thereby enabling the throughput to be enhanced furthermore, including the process for manufacturing a product to which an actuator is applied, so that the cost of manufacturing can be reduced. And, even if the actuator is activated by high field strength, the state of polarization remains unchanged, and rather a more preferable state of polarization is provided, and therefore, a higher degree of strain can be stably obtained. As a result, the actuator can be made more compact, which is preferable as an actuator.

Further, since the comb teeth 6 serving as driving parts 4 change a volume of each of the cells 3 by transformation due to expansion or shrinkage, thereby pressure is generated, it is not necessary to thin the driving parts 4 in order to obtain large displacement. Since this enables the actuator to maintain rigidity, the problem of a dull response is not caused. Thus, a large displacement and a high response can attain simultaneously without causing the conflict therebetween.

In a cell driving type actuator 1, the degree of profile for the cell surface is preferably approximately 8 μm or less, and the amount of unevenness of the wall surfaces facing each other of the piezoelectric/electrostrictive elements, i.e., the driving parts forming a cell is preferably approximately 10 μm or less. Moreover, the surface roughness Rt of the wall surfaces facing each other of the piezoelectric/ electrostrictive elements, i.e., the driving parts forming a cell is preferably approximately 10 μm or less. An actuator fulfilling at least one of these requirements has smooth inner walls of the driving parts forming a cell, thereby suppressing the concentration of the electric field and stress, and hence realizing a stable operation in the activation of respective cells.

The degree of surface profile is specified in Japanese Industrial Standard B0621: "the definition and representation of geometrical deviation". The surface profile implies a surface having a functionally predetermined shape, and the degree of profile for the surface is specified by the deviation of the surface contour from the geometrical contour, which is determined by theoretically predetermined dimensions. The cell surfaces in the present invention imply the inner wall surfaces of the driving parts forming the aforementioned cells.

In addition, "surface roughness" in the present invention denotes the surface roughness defined by Japanese Industrial Standard B0601: "surface roughness—the definition and representation". The surface roughness Rt has the same meaning as the maximum height Rmax defined by the difference in height between the highest point and the lowest point on the surface to be measured.

In the cell driving type actuator 1 shown in FIG. 1, the ratio of the minimum spacing between the adjacent piezoelectric/electrostrictive elements for forming a cell, i.e., the cell width W to the minimum spacing between the base plate and the cover plate, i.e., the cell height H, in other words, the aspect ratio W:H of a cell, is preferably substantially 1:2 to 1:40. The minimum spacing between the adjacent piezoelectric/electrostrictive elements for forming a cell, i.e., the cell width W, is preferably approximately 60 μm or less. More preferably, the aspect ratio W:H of a cell is 1:10 to 1:25 and the cell width W is approximately 50 μm or less. An actuator fulfilling at least one of these requirements, or, more preferably an actuator fulfilling both requirements, i.e., a thin actuator having a larger height provides a higher power with ease, thereby enabling a higher density to be realized, and making it possible to provide a more compact actuator.

Further, in the cell driving type actuator 1 shown in FIG. 1, the ratio of the spacing between a cell and the adjacent cells to the minimum spacing between the base plate and the cover plate is preferably approximately 1:2 to 1:40. The spacing between a cell and the adjacent cells, i.e., the cell spacing L, is preferably approximately 50 μm or less. More preferably, the ratio of the spacing between a cell and the adjacent cells to the minimum spacing between the base plate and cover plate is substantially 1:10 to 1:25, and the cell spacing L is approximately 30 μm or less. In the actuator fulfilling at least one of these requirements, or more preferably in the actuator fulfilling both requirements, each cell is independent of the cells adjacent thereto; nevertheless a greater number of cells can be provided, thereby providing a more compact actuator.

Therefore, when the cell driving type actuator 1 of the invention as shown in FIG. 1 is used as a liquid discharging device 100, a liquid can be simultaneously discharged from three adjacent cells 3, and the liquid can also be discharged with a higher density to an article to be sprayed. Referring to the drawings which demonstrate the following application examples, the cell driving type actuator of the present invention will be described hereinafter.

Figure 11:
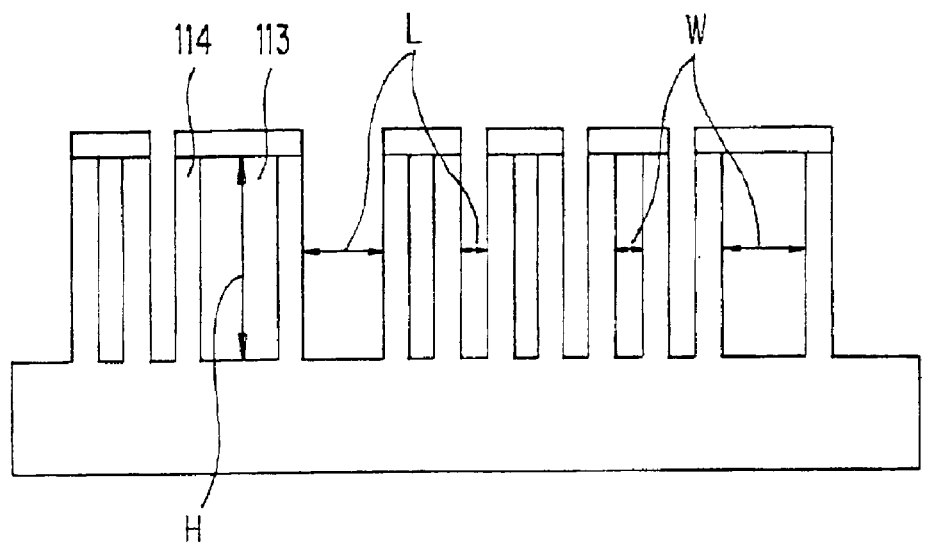
FIG. 11 is a sectional view showing an embodiment of a liquid discharging device to which the cell driving type actuator according to the invention is applied, wherein the cells are not identical with each other regarding the cell width and cell spacing, and have at least two different dimensions.

FIG. 11 is a sectional view of another embodiment having a cell driving type actuator according to the invention applied to a liquid-discharging device. In this case, the spacing between adjacent piezoelectric/electrostrictive elements forming a cell, i.e., the cell width W, and the spacing between a cell and the adjacent cells, i.e., the cell spacing L, have not been kept at fixed values, but have at least two different values, respectively. In other words, the cell width and the cell spacing L may be determined arbitrarily. With this arrangement, it is possible to easily discharge a desired amount of the droplets onto a desired position of an object.

Figure 12:
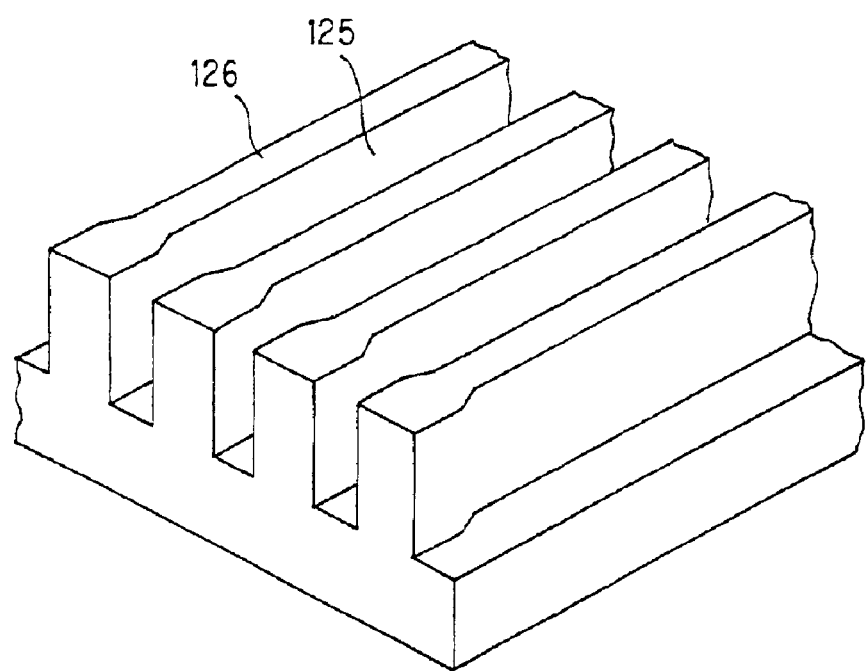
FIG. 12 is a perspective view showing an embodiment of a liquid-discharging device to which the cell driving type actuator according to the invention is applied, wherein the width of slits varies towards the front end of the comb teeth.

Moreover, FIG. 12 is a sectional view of another embodiment of a liquid-discharging device in which the cell driving type actuator according to the invention is used (the cover plate is not shown). The width of each comb-like piezoelectric/electrostrictive element, i.e., the width of each comb tooth 126, is determined in such a way that the width expands from the recess to the front end of the comb tooth. On the contrary, slits 125 forming cells are constructed in such a way that they are narrower at the front end of the comb teeth 126. Such a procedure of increasing the width at the front end of the comb teeth provides a smaller stress due to the piezoelectric deformation of the junction to the nozzle plates (shown in FIG. 1, but not shown in FIG. 12) adhered to the comb teeth at the front end, thereby making it possible to increase the service life without interposing any other elements therebetween. A similar effect can be obtained if the comb teeth are masked from the front end up to a predetermined distance, thus maintaining an area where there is no electrode.

As shown in the embodiment shown in FIG. 12, by altering the width of the comb tooth from the recess to the front end of the comb tooth, optimal properties can be obtained for the cell driving type actuator according to the invention, wherein an optimal width of the slit is adjusted in accordance with the application. As another embodiment, a better shape of liquid channel can be formed in the application of a liquid discharging device.

Figure 13A:
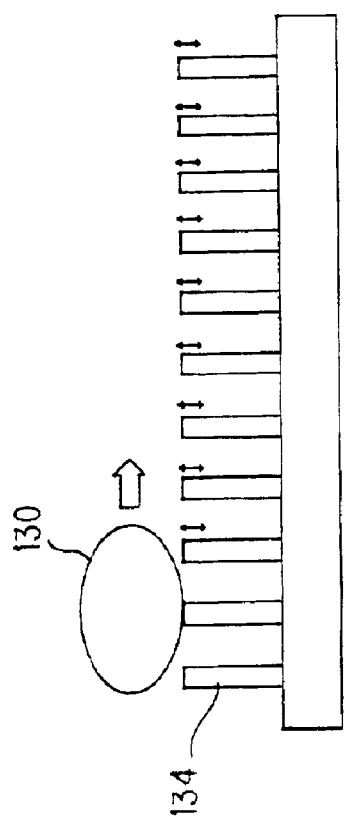
FIGS. 13(a) and 13(b) shows a shape of a cell driving type actuator of the present invention in the case that the cell driving type actuator is applied to a transportation apparatuses.
Figure 13B:
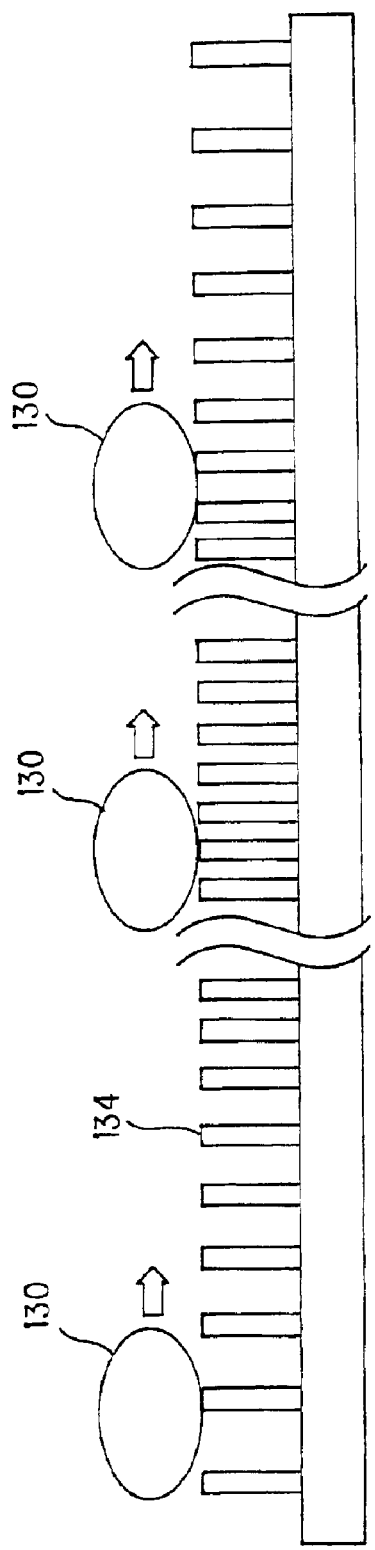

FIG. 13(a) and FIG. 13(b) show a transportation apparatus, in which the cell driving type actuator according to the present invention is used (although the cover plates are not shown, the cover plates can be removed). In FIG. 13(a), driving parts 134, that is, comb teeth, are formed in such a way that the slits have the same width, thus providing transportation at a constant speed; whereas in FIG. 13(b), the driving parts 134, i.e., the comb teeth, are formed in such a way that the width of a slit varies, hence the speed of transportation changes. An electric field is applied to the individual driving parts 134, as shown in FIG. 13(a), and then the driving parts 134 are deformed, thereby expanding or contracting in the direction indicated by the arrow, so that all the driving parts exhibit a wave-like displacement as a whole. Consequently, it is possible to convey a product 130 to be transported by carrying it on the wave. In the process of manufacturing fine products, there are several problems regarding the transportation thereof. However, if a transportation apparatus is formed by the use of such a cell driving type actuator, it is possible to attain smooth movement in the transportation of micro-machines with ease.

Moreover, a cell driving type actuator according to the present invention can be used as an actuator for changing the direction of a light reflecting mirror; acting as, e.g., an optical switch for switching waveguides for optical signals in an optical communication network, or a projector component, or for a micro-mirror or the like used in a laser unit used in a CD-R/RW apparatus.

Figure 10A:
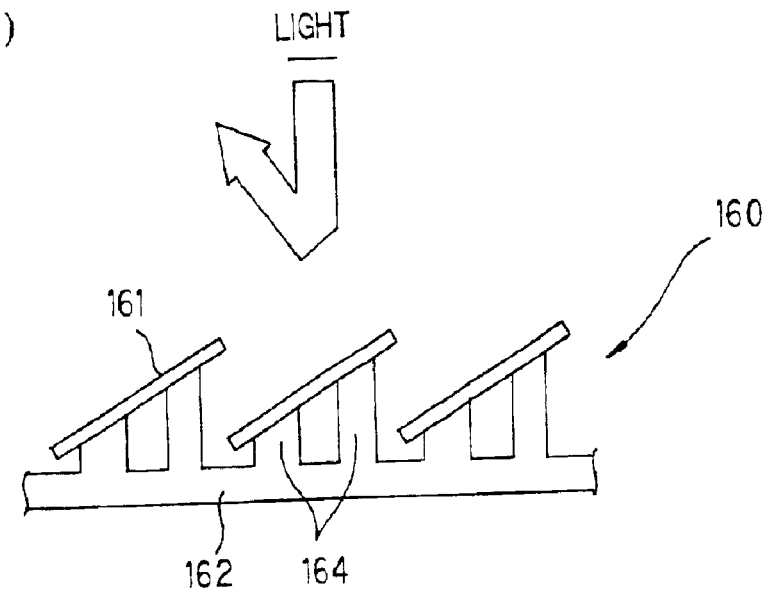
FIGS. 10(a) and 10(b) are sectional views each showing an embodiment of a cell driving type actuator according to the invention, which is applied to a micro-mirror device.
Figure 10B:
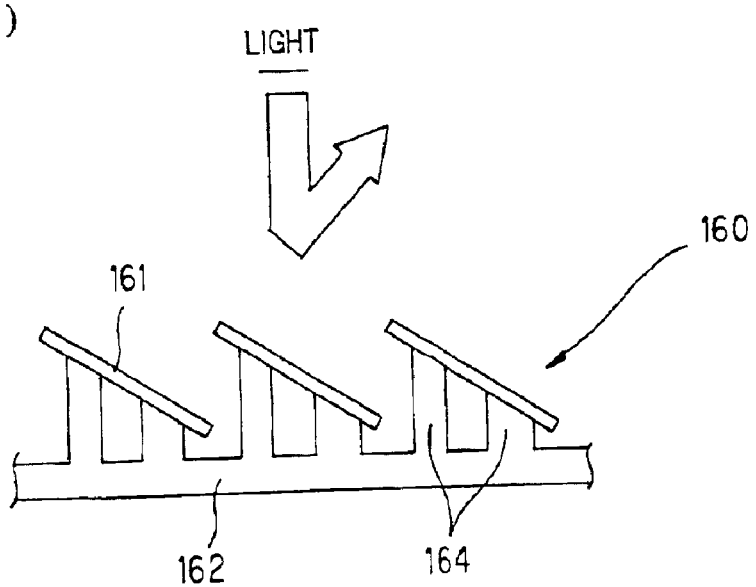

FIG. 10(a) and FIG. 10(b) are sectional views showing an embodiment of a micro-mirror device in which a cell driving type actuator according to the invention is used. In this case, the direction of the surface of a mirror 161 is altered to reflect light in different directions. In a micro-mirror device 160, a plurality of driving parts 164, which are piezoelectric/electrostrictive elements, are placed on a base plate 162 and a micro-mirror 161 is mounted onto, for instance, two to four driving parts 164. The expansion and contraction of specified driving parts 164, to each of which an electric field is applied, make the direction of the micro-mirror 161 change, thereby changing the direction of the reflected light.

Next, methods for manufacturing a cell driving type actuator according to the present invention will be explained. There are two manufacturing methods:

An example of the steps in the first method for manufacturing the cell driving type actuator is schematically shown in FIG. 4(a)–FIG. 4(e). In this manufacturing method, a punch and a die are used: In FIG. 4(a), a predetermined number of green sheets 16 made of piezoelectric/electrostrictive material are diecut in a comb-like form with a punch, thus machining slit apertures 15 in each green sheet 16. In FIG. 4(b), the green sheets are positioned and laminated on a base plate 2, thereby forming the comb-like piezoelectric/electrostrictive elements having a predetermined thickness. Thereafter, the green sheets are fired and unified into one body, for instance, as shown in FIG. 4(c), and undergo the treatment for causing polarization as necessary, as shown in FIG. 4(d), and then electrodes 19 and the others are formed, as shown in FIG. 4(e). The method of positioning the green sheets in the lamination process is realized either by successively stacking said green sheets within a frame having the same inner shape which substantially corresponds to the outer shape of the green sheets, or by successively stacking said green sheets, for instance, by passing a guide pin through a predetermined guide hole in each green sheet, so that the positioning is carried out, for instance, under a pressurized state at a high temperature. In this case, the cover plate can also be formed with a green sheet of the same material, thereby the process of laminating, firing and unifying into one body is similarly applied.

Subsequently, the second manufacturing method will be explained based on the drawings: FIG. 2(a)–FIG. 2(e) are drawings showing an embodiment of the second method for manufacturing a cell driving type actuator according to the invention. FIG. 2(a)–FIG. 2(d) schematically show the steps of the process, and FIG. 2(e) schematically shows a finished actuator.

The second manufacturing method comprises the steps of: first forming slit apertures 15 in a green sheet 16 (hereafter simply denoted by sheet), as in FIG. 2(a), and at the same time, laminating with a method which will be described later; forming comb teeth by laminating the sheets 16; and then completing the lamination together with punching, thereby forming comb-like piezoelectric/electrostrictive elements having a predetermined thickness.

Subsequently, for instance, comb teeth are formed on the base plate 2 made of the sheets prepared for independently, and the sheets laminated are laid on the base plate in FIG. 2(b). In FIG. 2(c), all the sheets are pressurized under heating, thus bringing them into tight contact with each other. In FIG. 2(d), all the sheets and the base plate 2 are unified by firing, thereby finishing the driving parts. After that, electrodes 6 are formed on the wall of the slits, thus enabling the finished cell driving type actuator to be provided as in FIG. 2(e). The green sheets can be formed by conventional means for forming a film, such as the doctor blade method.

Figure 6A:
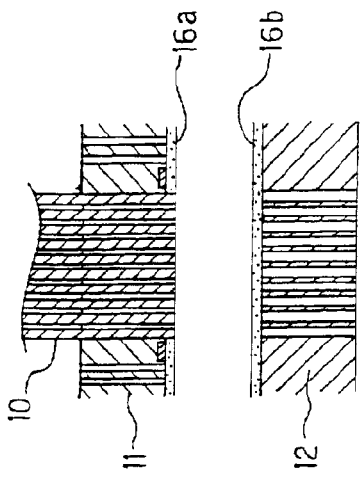
FIGS. 6(a)–6(e) are drawings for explaining steps of an embodiment of a method for machining slit apertures in green sheets shown in FIGS. 2(a)–2(e) and simultaneously laminating the green sheets.
Figure 6B:
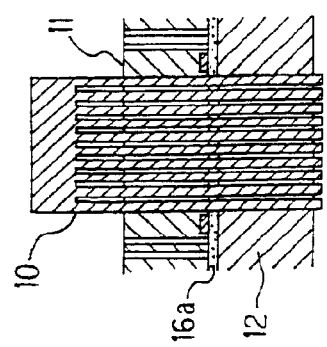

FIG. 6(a)–FIG. 6(e) show the concrete steps of simultaneous punching and laminating method employed in the aforementioned second method. In this case, a die assembly consisting of a punch 10 and a die 12 is used, and a stripper 11 for laminating the sheets 16 is arranged around the die assembly. FIG. 6(a) shows conditions that a first sheet 16a is laid on the die 12 before punching. In FIG. 6(b), the punch 10 and the stripper 11 fall, thus punching slit apertures in the sheet 16, and then comb teeth are formed (first step).

Figure 6C:
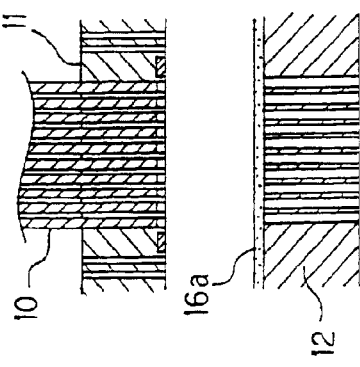

Then, a second sheet 16b is provided for punching. In this case, as shown in FIG. 6(c), the first sheet 16a is moved upwards into tight contact with the stripper 11 and is then removed from the die 12 (second step). The method for tightly covering the sheet 16 on the stripper 11 can be realized, for instance, by evacuating suction openings formed in the stripper 11.

In order to diecut the second sheet 16b, the punch 10 and the stripper 11 are moved upwards from the die 12. In the upward movement, preferably, the front end of the punch 10 should not be returned into the slit apertures of the first sheet 16a which simultaneously moves upwards, and in the case of deactivation, it is important to fix the front end at a position slightly withdrawn from the lowest part of the first sheet 16a which simultaneously moves upwards (third step). If the punch 10 is returned to the slit apertures of the first sheet 16a, or is completely inserted into the stripper 11, the slit apertures formed are deformed, because the sheet 16a is soft. Therefore, the flatness of the side face of the comb teeth is reduced when the sheets 16 are laminated to form the comb teeth.

Figure 6D:
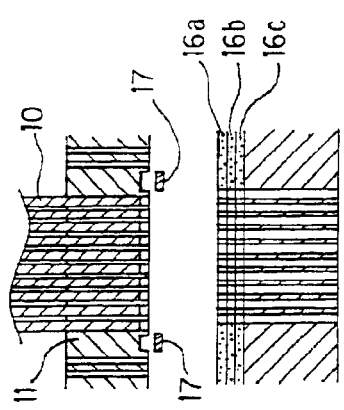

FIG. 6(d) shows the step of punching the second sheet 16b. The second sheet 16b can easily be laid on the die 12 by tightly stacking the first sheet 16a on the stripper 11, so that punching can be performed as in the process of FIG. 6(b), and at the same time, the second sheet is laid on the first sheet 16a (fourth step).

By repeating the steps of FIG. 6(c) and FIG. 6(d), the second sheet 16b is laid on the first sheet 16a, these sheets are moved upwards (fifth step), and then the third sheet 16c is prepared for punching. In this case, it is also important to keep the sheet at a position slightly withdrawn from the lowest part of the sheet 16 which simultaneously moves upwards (sixth step). After that, by repeating the fourth step to the sixth step, the punching and laminating are repeated till a necessary number of the sheets 16 are obtained.

Figure 6E:
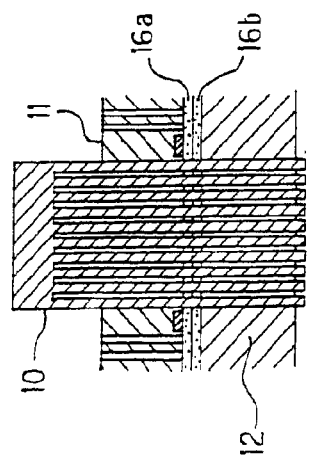
Figure 7:
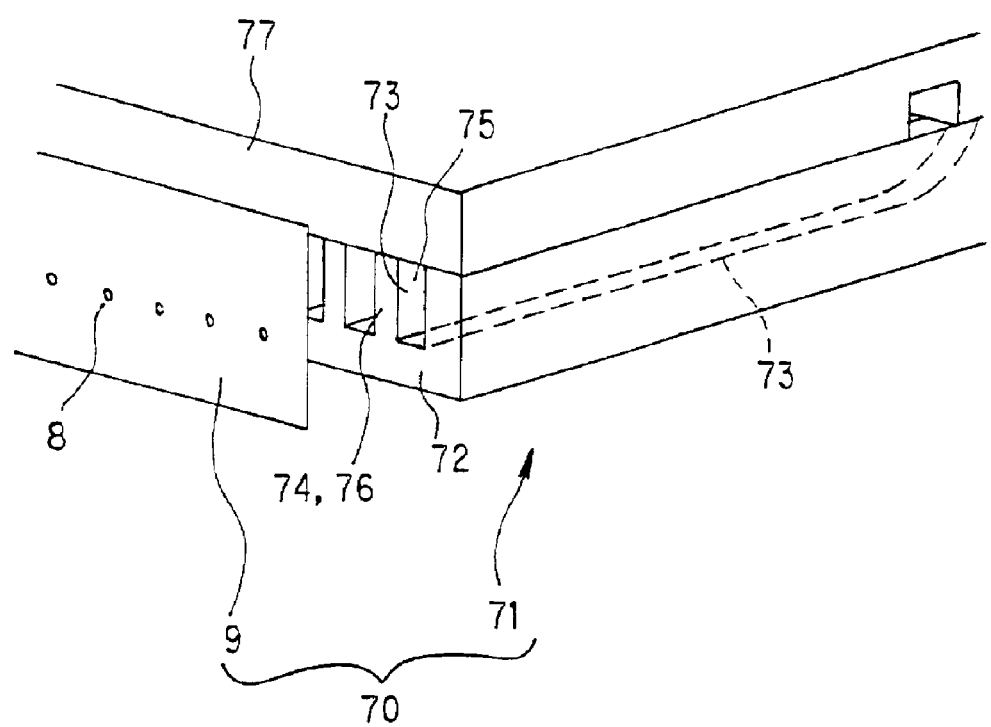
FIG. 7 is a perspective view showing an embodiment of an ink jet head equipped with a conventional piezoelectric/ electrostrictive actuator.
Figure 9A:
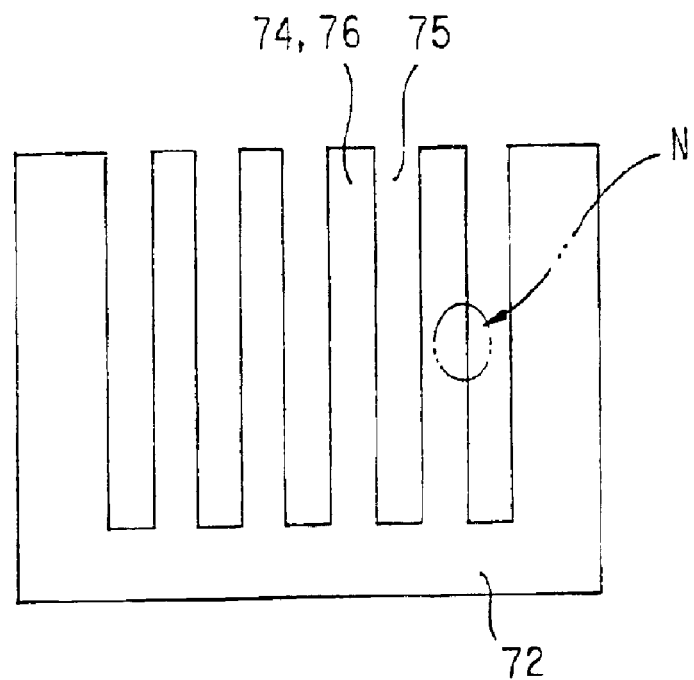
FIGS. 9(a) and 9(b) are explanatory views of the conventional piezoelectric/electrostrictive actuator shown in FIGS. 8(a)–8(e) in the course of the process in the method for manufacturing the same.
Figure 9B:
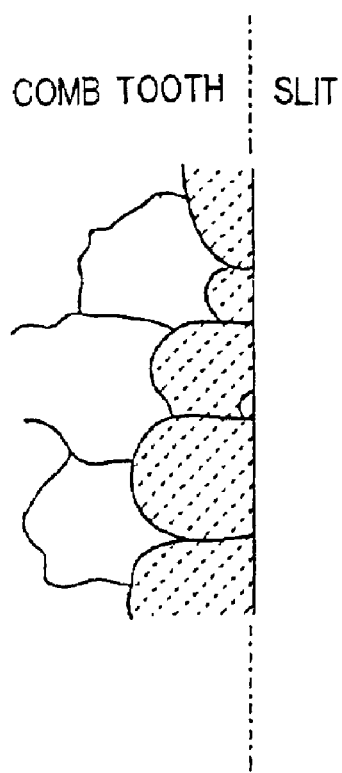

FIG. 6(e) shows the state in which the punching has been completed. After the punching and laminating of the necessary number of the sheets 16 are completed, the sheets 16 which are held by the stripper 11 are released, and the punched and laminated sheets 16 can be taken out after removing them from the stripper 16. The removing from the stripper 11 can be securely achieved by applying a separation tool 17 to the lower surface of the stripper 11.

The aforementioned procedure is that used in the manufacturing method disclosed in Japanese Patent Application No. 2000-280573, and a comb-like multi-slit laminated product having a predetermined thickness can be obtained with this procedure.

Thereafter, for instance, the laminated product is laid on the base plate 2 comprising green sheets of the piezoelectric/electrostrictive material, and the lamination step is performed under pressure, thereby producing a lamination product capable of handling. Subsequently, the laminated product is fired and unified under conditions suitable for the properties of the sheet, and thereby a cell driving type actuator can be obtained.

Figure 5A:
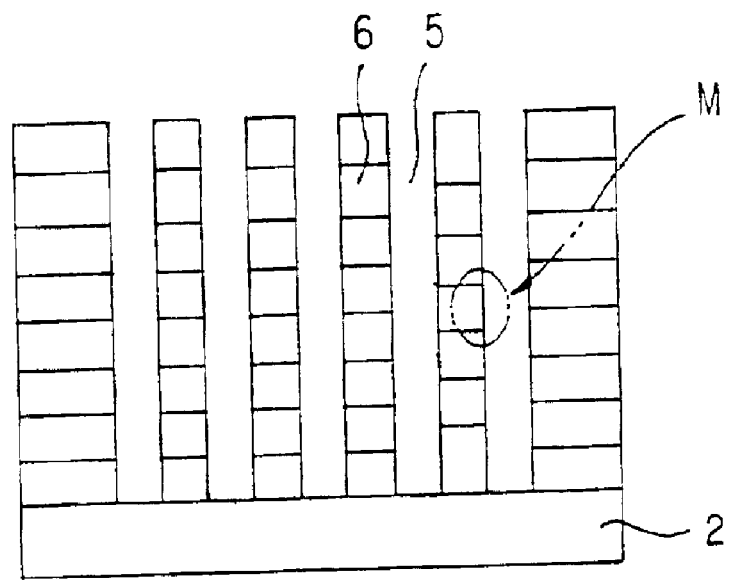
FIGS. 5(a) and 5(b) are explanatory views of the cell driving type actuator according to the invention shown in FIGS. 2(a)–2(e) under the conditions in the course of the process in the method for manufacturing the same.
Figure 5B:
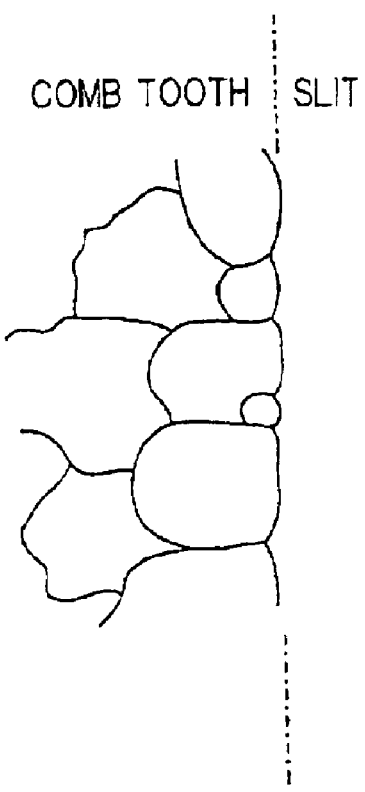

FIG. 5(a) shows a side view from P in FIG. 2(d), and FIG. 5(b) schematically shows an enlarged section of part M in the wall surface of slit 5 shown in FIG. 5(a). In the second method for manufacturing a cell driving type actuator according to the present invention, the slit wall surfaces, which will later become a cell, are formed with fired surfaces since the comb-like shape is formed before firing. In the case of machining slits with a dicing unit or the like after the piezoelectric/electrostrictive material is fired, micro cracks and transgranular fractures are generated, for example, on the slit wall surfaces. However, according to the method for manufacturing a cell driving type actuator of the present invention, such things do not happen, and crystal grains on a side face of a comb-tooth-like piezoelectric/electrostrictive element forming a cell, are under such a condition that crystal grains having a transgranular fracture is 1% or less, which is substantially equal to zero, so that no deterioration in the characteristics occurs, thereby enhancing the durability and reliability. Moreover, fractures at the corners (chipping) hardly occur during machining, and there is no need of the steps of cleaning and drying because no dicing step is employed.

As the accuracy in stacking the green sheets in the second method for manufacturing a cell driving type actuator according to the present invention, for example, in the case where 10 green sheets each having a thickness of 50 μm and a Young's modulus of 39 N/mm² are punched to form teeth of a comb to provide a slit width of 50 μm and a comb tooth width of 30 μm, and then laminated, the deviation between the respective layers after firing is 4 μm at maximum and the surface roughness Rt is approximately 7 μm. As shown in FIG. 5(b), comb teeth having smooth and even side faces can be provided. In addition, since the side faces of the comb teeth have fired surfaces, crystal grains of piezoelectric/electrostrictive element does not have a transgranular fracture though they are crystal grains on the surfaces, and crystal grains having a transgranular fracture can be suppressed to be 1% or less. Moreover, the slit width after firing was about 40 μm due to contraction during firing.

As in the above, forming slit apertures in the green sheets with the die and punch simultaneously allows the green sheets to be laminated. The punch itself can be used as an axis for adjusting the laminating position of the green sheets, and the deformation of the apertures in the punched slits can be avoided with the aid of the punch. As a result, no deformation occurs in the slit apertures and the deviation between laminated green sheets is reduced to be 5 μm or less. Therefore, it is possible to obtain high precision lamination and to form uneven wall surfaces of the slits. Hence, slits having a high aspect ratio of 10 to 25, said slits later forming the cells, can be formed with ease, even for comb tooth having a slit width of less than 70 μm, and an actuator having excellent properties can be provided.

In addition, since there are neither micro cracks in the wall surfaces of slits between comb-teeth-like piezoelectric elements nor transgranular fractures of grains, no deterioration of the characteristics due to residual stress occurs. Further, the aforementioned second method requires neither tools for moving the sheets nor spaces for stacking the sheets, thereby simplifying the production line and enabling low cost production to be obtained.

Further, in the aforementioned first and second manufacturing methods, the slit width is substantially the same as the punch machining width in the die assembly when the sheets are punched. However, since the sheets contract during firing, the combination of thin machined slits and the shrinkage during firing makes it possible to form very small slits having a thickness of 40 μm or less. Depending on the design of the die assembly for punching, e.g., changing the shape of the die, slits having a shape other than a straight line can easily be formed, so that an optimal shape can be provided in accordance with the application.

FIG. 3(a)–FIG. 3(e) show another embodiment of the second method for manufacturing a cell driving type actuator according to the present invention. First, as in FIG. 3(a), both forming of slit apertures 25 not having a comb-teeth-like shape and laminating are simultaneously carried out on each sheet 16, thereby providing a laminated product. After completing the forming of the apertures and lamination, the laminated product is laid on the base plate 2 comprising sheets in FIG. 3(b), and then, all of the layers are, for instance, pressurized under heating, thereby being brought into tight contact with each other as shown in FIG. 3(c), and they are fired and unified into one body as shown in FIG. 3(d). These manufacturing steps are identical to those in FIG. 2. In this example, however, the slit apertures punched are elongated, both ends thereof being closed, and are formed in a comb-like shape by cutting them at one end after firing, as shown in FIG. 3(e). Then, after forming electrodes and the like, the manufacturing process is completed.

In such a method of lamination without direct punching of comb teeth, but connecting them to each other at both ends of the comb teeth, a process of cutting the end part is required after firing, hence steps of cleaning and drying the parts after removing them are required. Nevertheless, the accuracy of stacking comb teeth in the sheets can be further enhanced.

Industrial Applicability

As mentioned above in detail, the present invention solves the first to eighth problems in the conventional art, and offers a cell driving type actuator and a method for manufacturing the actuator based on the principle of utilizing only a strain caused by an electric field; wherein a heating process at a high temperature can be applied, mass production at low cost is possible; the slit portions may have a cell which has a shape other than a straight one, a width of 60 μm or less, and a high aspect ratio, the cells can be activated with high electric field strength, and great displacement can be obtained with small electric field strength.

What is claimed is:

1. A cell driving type actuator, comprising:
   a base plate;
   a plurality of piezoelectric/electrostrictive elements arranged on said base plate and extending substantially perpendicularly therefrom, wherein side walls of each piezoelectric/electrostrictive element are formed by firing only and a width of the piezoelectric/electrostrictive elements varies from a recess to a front end of the piezoelectric/electrostrictive elements; and a plurality of cover plates, each joining top portions of adjacent piezoelectric/electrostrictive elements to one another to define a plurality of cells.

2. A cell driving type actuator according to claim 1, wherein the polarization field of said piezoelectric elements and the driving electric field are aligned in the same direction.

3. A cell driving type actuator according to claim 1, wherein the degree of profile for the surface of said cells is approximately 8 µm or less.

4. A cell driving type actuator according to claim 1, wherein a ratio of a minimum spacing between the adjacent piezoelectric/electrostrictive elements forming said cells to a minimum spacing between said base plate and said cover plate is approximately 1:2 to 1:40.

5. A cell driving type actuator according to claim 1, wherein a ratio of a spacing between adjacent cells to a minimum spacing between said base plate and said cover plate is approximately 1:2 to 1:40.

6. A cell driving type actuator according to claim 1, wherein a minimum spacing between the adjacent piezoelectric/electrostrictive elements forming said cells is approximately 60 µm or less.

7. A cell driving type actuator according to claim 6, wherein the spacing between adjacent cells is approximately 50 µm or less.

8. A cell driving type actuator according to claim 1, wherein the surface roughness Rt of the walls of the piezoelectric/electrostrictive elements is approximately 10 µm or less, said piezoelectric/electrostrictive elements facing one another and forming said cells.

9. A cell driving type actuator according to claim 1, wherein a spacing distance between the adjacent piezoelectric/electrostrictive elements forming at least one of said cells is different from a spacing distance between piezoelectric/electrostrictive elements forming at least one other cell.

10. A cell driving type actuator according to claim 1, further comprising electrode films formed on both surfaces of the side walls and said side walls are expanded/contracted in up/down directions in response to a driving electric field resulting from an application of voltage to said electrode films.

11. A cell driving type actuator according to claim 1, wherein the state of crystalline grains on surfaces of the side walls is such that the crystal grains suffering from a transgranular fracture are 1% or less.

12. A liquid discharging device including a cell driving type actuator, comprising:

a base plate;

a plurality of piezoelectric/electrostrictive elements arranged on said base plate and extending substantially perpendicularly therefrom, wherein side walls of each piezoelectric/electrostrictive element are formed by firing only and a width of the piezoelectric/electrostrictive elements varies from a recess to a front end of the piezoelectric/electrostrictive elements, and wherein a polarization field of said piezoelectric/electrostrictive elements and a driving electric field are aligned in the same direction;

a plurality of cover plates, each joining top portions of adjacent piezoelectric/electrostrictive elements to one another to define a plurality of cells, wherein each cell of said plurality of cells is a liquid pressurizing chamber that deforms to eject a liquid therefrom when said piezoelectric/electrostrictive elements are expanded/contracted in up/down directions in response to said driving electric field resulting from an application of voltage to said piezoelectric/electrostrictive elements.

* * * * *

UNITED STATES PATENT AND TRADEMARK OFFICE
CERTIFICATE OF CORRECTION

PATENT NO. : 6,933,663 B2
DATED : August 23, 2005
INVENTOR(S) : Yukihisa Takeuchi et al.

It is certified that error appears in the above-identified patent and that said Letters Patent is hereby corrected as shown below:

<u>Title page,</u>
Item [30], Foreign Application Priority Data, please delete:
"Jun. 22, 2001   (JP) ………………………………… 2001-189718".

Signed and Sealed this

Twenty-second Day of November, 2005

JON W. DUDAS
*Director of the United States Patent and Trademark Office*